United States Patent
Uppaluri et al.

(10) Patent No.: US 10,706,522 B2
(45) Date of Patent: Jul. 7, 2020

(54) SYSTEM AND METHOD FOR GENERATION OF WAFER INSPECTION CRITICAL AREAS

(71) Applicant: KLA-Tencor Corporation, Milpitas, CA (US)

(72) Inventors: Prasanti Uppaluri, Saratoga, CA (US); Rajesh Manepalli, Telangana (IN); Ashok V. Kulkarni, San Jose, CA (US); Saibal Banerjee, Fremont, CA (US); John Kirkland, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/394,545

(22) Filed: Dec. 29, 2016

(65) Prior Publication Data

US 2018/0130195 A1    May 10, 2018

(51) Int. Cl.
*G06T 7/00* (2017.01)
*H01L 21/66* (2006.01)

(52) U.S. Cl.
CPC .......... *G06T 7/0004* (2013.01); *G06T 7/0006* (2013.01); *H01L 22/12* (2013.01); *G06T 2207/10061* (2013.01); *G06T 2207/30148* (2013.01)

(58) Field of Classification Search
None
See application file for complete search history.

(56) References Cited

U.S. PATENT DOCUMENTS

| | | | |
|---|---|---|---|
| 5,619,588 A * | 4/1997 | Yolles | G06T 7/001 382/149 |
| 5,805,278 A | 9/1998 | Danko | |
| 6,621,570 B1 | 9/2003 | Danko | |
| 7,092,082 B1 | 8/2006 | Dardzinski | |
| 7,570,796 B2 | 8/2009 | Zafar et al. | |
| 7,676,077 B2 | 3/2010 | Kulkarni et al. | |
| 8,664,594 B1 | 3/2014 | Jiang et al. | |

(Continued)

FOREIGN PATENT DOCUMENTS

KR    20120014886 A    2/2012

OTHER PUBLICATIONS

MediaCollege, https://www.rnediacollege.com/graphics/files/naming.html, available 2004 (Year: 2004).*

(Continued)

*Primary Examiner* — Mark Roz
(74) *Attorney, Agent, or Firm* — Suiter Swantz pc llo (57) ABSTRACT

A method includes receiving one or more sets of wafer data, identifying one or more primitives from one or more shapes in one or more layers in the one or more sets of wafer data, classifying each of the one or more primitives as a particular primitive type, identifying one or more primitive characteristics for each of the one or more primitives, generating a primitive database of the one or more primitives, generating one or more rules based on the primitive database, receiving one or more sets of design data, applying the one or more rules to the one or more sets of design data to identify one or more critical areas, and generating one or more wafer inspection recipes including the one or more critical areas for an inspection sub-system.

32 Claims, 4 Drawing Sheets

(56) References Cited

U.S. PATENT DOCUMENTS

| | | |
|---|---|---|
| 8,692,204 B2 | 4/2014 | Kojima et al. |
| 8,698,093 B1 | 4/2014 | Gubbens et al. |
| 8,716,662 B1 | 5/2014 | MacDonald et al. |
| 8,923,600 B2 | 12/2014 | Zafar et al. |
| 2008/0250384 A1 | 10/2008 | Duffy et al. |
| 2009/0290782 A1 | 11/2009 | Regensburger |
| 2011/0032348 A1* | 2/2011 | Lim .................. G06T 7/0006 |
| | | 348/87 |
| 2014/0177940 A1 | 6/2014 | Nakagaki et al. |
| 2014/0301630 A1 | 10/2014 | Kulkarni et al. |
| 2015/0048741 A1 | 2/2015 | Shortt et al. |
| 2015/0333471 A1 | 11/2015 | Chimmalgi et al. |
| 2015/0357179 A1 | 12/2015 | Wilson et al. |

OTHER PUBLICATIONS

Fulong Cheng, XML Component-Based Modeling for Digital Circuits, 2010 Second Pacific-Asia Conference on Circuits, Communications and System (PACCS), © 2010 IEEE (Year: 2010).*
International Search Report dated Feb. 13, 2018 for PCT/US2017/058887.
U.S. Appl. No. 14/178,866, filed Feb. 12, 2014, Allen Park et al.
U.S. Appl. No. 15/355,606, filed Nov. 18, 2016, Saibal Banerjee et al.

* cited by examiner

# SYSTEM AND METHOD FOR GENERATION OF WAFER INSPECTION CRITICAL AREAS

CROSS REFERENCE TO RELATED APPLICATIONS

The present application claims priority to India Provisional Patent Application No. 201641038208, filed Nov. 8, 2016, entitled A METHOD FOR AUTOMATIC GENERATION OF INSPECTION REGIONS FROM DESIGN DATA AND SAMPLE IMAGE EXAMPLES, naming Prasanti Uppaluri, Rajesh Manepalli, Ashok Kulkarni, Saibal Banerjee, and John Kirkland as inventors, which is incorporated herein by reference in the entirety.

TECHNICAL FIELD

The present invention relates to wafer inspection and review, and more particularly, to generating one or more critical areas based on design data, SEM (Scanning Electron Microscope) sample images, high-resolution images representing the design intent, or simulated images for generating one or more wafer inspection recipes.

BACKGROUND

Fabricating semiconductor devices such as logic and memory devices typically includes processing a substrate such as a semiconductor wafer using a large number of semiconductor fabrication processes to form various features and multiple levels of the semiconductor devices. Multiple semiconductor devices may be fabricated in an arrangement on a single semiconductor wafer and then separated into individual semiconductor devices.

Semiconductor devices may develop defects during the fabrication processes. Inspection processes are performed at various steps during a semiconductor manufacturing process to detect defects on a specimen. Inspection processes are an important part of fabricating semiconductor devices such as integrated circuits, becoming even more important to successfully manufacture acceptable semiconductor devices as the dimensions of semiconductor devices decrease. For instance, detection of defects has become highly desirable as the dimensions of semiconductor devices decrease, as even relatively small defects may cause unwanted aberrations in the semiconductor devices.

Methods of defect detection include generating one or more wafer inspection recipes with one or more critical areas, the one or more critical areas based on wafer design data, SEM or high-resolution optical inspection images representing the design intent, or simulated images. These methods of defining critical areas, however, can be laborious and/or computationally intensive, thus requiring inspection expertise. Additionally, these methods of defining critical areas may results in wafer inspection recipes that are too limited in scope, potentially missing defects. Further, these methods may potentially miss defects because the one or more defects and signal noise are not separable (i.e. the defects are lost in noise). As such, it would be desirable to provide a solution for improved wafer inspection and defect classification to resolve manufacturing issues and provide improved wafer inspection capabilities.

SUMMARY

A system for generating one or more wafer inspection recipes for wafer inspection is disclosed, in accordance with one or more embodiments of the present disclosure. In one illustrative embodiment, the system includes an inspection sub-system. In another illustrative embodiment, the system includes a controller communicatively coupled to the inspection sub-system. In another illustrative embodiment, the controller includes one or more processors configured to execute a set of program instructions stored in memory. In another illustrative embodiment, the program instructions are configured to cause the one or more processors to receive one or more sets of wafer data. In another illustrative embodiment, the one or more sets of wafer data include one or more layers. In another illustrative embodiment, the one or more layers include one or more shapes. In another illustrative embodiment, the program instructions are configured to cause the one or more processors to identify one or more primitives from the one or more shapes. In another illustrative embodiment, the program instructions are configured to cause the one or more processors to classify each of the one or more primitives as a particular primitive type. In another illustrative embodiment, the program instructions are configured to cause the one or more processors to identify one or more primitive characteristics for each of the one or more primitives. In another illustrative embodiment, the program instructions are configured to cause the one or more processors to generate a primitive database of the one or more primitives. In another illustrative embodiment, the primitive database includes the particular primitive type classification and the one or more identified primitive characteristics for each of the one or more primitives. In another illustrative embodiment, the program instructions are configured to cause the one or more processors to generate one or more rules based on the primitive database. In another illustrative embodiment, the program instructions are configured to cause the one or more processors to receive one or more sets of design data. In another illustrative embodiment, the program instructions are configured to cause the one or more processors to apply the one or more rules to the one or more sets of design data to identify one or more critical areas. In another illustrative embodiment, the program instructions are configured to cause the one or more processors to generate one or more wafer inspection recipes for the inspection sub-system. In another illustrative embodiment, the recipes include the one or more critical areas.

A method for generating one or more wafer inspection recipes for wafer inspection is disclosed, in accordance with one or more embodiments of the present disclosure. In one illustrative embodiment, the method includes receiving one or more sets of wafer data. In another illustrative embodiment, the one or more sets of wafer data include one or more layers. In another illustrative embodiment, the one or more layers include one or more shapes. In another illustrative embodiment, the method includes identifying one or more primitives from the one or more shapes. In another illustrative embodiment, the method includes classifying each of the one or more primitives as a particular primitive type. In another illustrative embodiment, the method includes identifying one or more primitive characteristics for each of the one or more primitives. In another illustrative embodiment, the method includes generating a primitive database of the one or more primitives. In another illustrative embodiment, the primitive database includes the particular primitive type classification and the one or more identified primitive characteristics for each of the one or more primitives. In another illustrative embodiment, the method includes generating one or more rules based on the primitive database. In another illustrative embodiment, the method includes receiving one or more sets of design data. In another illustrative embodiment, the method includes applying the one or more rules to the one or more sets of design data to identify one or more critical areas. In another illustrative embodiment, the method includes one or more wafer inspection recipes for the inspection sub-system. In another illustrative embodiment, the recipes include the one or more critical areas.

A system for generating one or more wafer inspection recipes for wafer inspection is disclosed, in accordance with one or more embodiments of the present disclosure. In one illustrative embodiment, the system includes an inspection sub-system. In another illustrative embodiment, the system includes a controller communicatively coupled to the inspection sub-system. In another illustrative embodiment, the controller includes one or more processors configured to execute a set of program instructions stored in memory. In another illustrative embodiment, the program instructions are configured to cause the one or more processors to receive one or more sets of wafer data. In another illustrative embodiment, the one or more sets of wafer data include one or more layers. In another illustrative embodiment, the one or more layers include one or more shapes. In another illustrative embodiment, the program instructions are configured to cause the one or more processors to identify one or more primitives from the one or more shapes. In another illustrative embodiment, the program instructions are configured to cause the one or more processors to identify a combined classification for each of the one or more primitives. In another illustrative embodiment, the program instructions are configured to cause the one or more processors to generate a primitive database of the one or more primitives. In another illustrative embodiment, the primitive database includes the combined classification for each of the one or more primitives. In another illustrative embodiment, the program instructions are configured to cause the one or more processors to generate one or more rules based on the primitive database. In another illustrative embodiment, the program instructions are configured to cause the one or more processors to receive one or more sets of design data. In another illustrative embodiment, the program instructions are configured to cause the one or more processors to apply the one or more rules to the one or more sets of design data to identify one or more critical areas. In another illustrative embodiment, the program instructions are configured to cause the one or more processors to generate one or more wafer inspection recipes for the inspection sub-system. In another illustrative embodiment, the recipes include the one or more critical areas.

A method for generating one or more wafer inspection recipes for wafer inspection is disclosed, in accordance with one or more embodiments of the present disclosure. In one illustrative embodiment, the method includes receiving one or more sets of wafer data. In another illustrative embodiment, the one or more sets of wafer data include one or more layers. In another illustrative embodiment, the one or more layers include one or more shapes. In another illustrative embodiment, the method includes identifying one or more primitives from the one or more shapes. In another illustrative embodiment, the method includes identifying a combined classification for each of the one or more primitives. In another illustrative embodiment, the method includes generating a primitive database of the one or more primitives. In another illustrative embodiment, the primitive database includes the combined classification for each of the one or more primitives. In another illustrative embodiment, the method includes generating one or more rules based on the primitive database. In another illustrative embodiment, the method includes receiving one or more sets of design data. In another illustrative embodiment, the method includes applying the one or more rules to the one or more sets of design data to identify one or more critical areas. In another illustrative embodiment, the method includes one or more wafer inspection recipes for the inspection sub-system. In another illustrative embodiment, the recipes include the one or more critical areas.

It is to be understood that both the foregoing general description and the following detailed description are exemplary and explanatory only and are not necessarily restrictive of the present disclosure. The accompanying drawings, which are incorporated in and constitute a part of the characteristic, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring to FIGS. 1 through 4, a method and system for automatically generating one or more critical areas for use during wafer inspection is disclosed, in accordance with one or more embodiments of the present disclosure.

One method for generating one or more critical areas for use during wafer inspection includes searching for a Pattern of Interest (POI) with a pattern search algorithm (e.g., a Fast Pattern Search algorithm). The algorithm may then search the design for matches to the POI to output a list of all locations where the POI exists. However, a pattern search algorithm may only output a list of all locations exactly matching the POI, potentially missing regions that are similar to the POI and of equal criticality to the wafer (in terms of probability of pattern failure). Another method for generating one or more critical areas for use during wafer inspection includes a rule-based solution, which could be used to find all locations in the design matching the POI.

These rules have to be manually written, however, which requires expertise, is tedious, and is error-prone.

As such, embodiments of the present disclosures are directed to an improved system and method for generating one or more critical areas capable of broader detection of one or more defects for use in wafer inspection and review processes. Embodiments of the present disclosure are also directed to suppressing noise coming from surrounding areas on the inspected wafer.

For purposes of the present disclosure, the terms "design", "design data", and "die design" as used herein refer to the physical design (layout) of an integrated circuit (IC) and data derived from the physical design through complex simulation or simple geometric and Boolean operations. For example, the physical design may be stored in a data structure such as a Graphic Data System (GDS) file, any other standard machine-readable file, or any other suitable file known in the art. IC layout data or chip design data is provided in a number of formats including, but not limited to, GDSII and OASIS formats. A GDSII file is one of a class of files used for the representation of design layout data. Other examples of such files include, but are not limited to, GL1 and OASIS files and proprietary file formats such as Reticle Design File (RDF) data, which is proprietary to KLA-Tencor, Milpitas, Calif. ("KT").

Design data is encoded with the manufacturing, logical, and electrical intent of the particular chip. Design data may be an output of Electronic Design Automation (EDA) tools. For example, the design data output from EDA tools may be processed by analysis software and converted to RDF format. For purposes of the present disclosure, wafer data is an image representation of what is actually manufactured and/or printed.

It is noted herein an image of a reticle acquired by a reticle inspection system and/or derivatives thereof may be used as a "proxy" or "proxies" for the design. Such a reticle image or a derivative thereof may serve as a substitute for the design layout in any embodiments described herein that use a design. The design may include any other design data or design data proxies described in U.S. Pat. No. 7,570,796, issued on Aug. 4, 2009; and U.S. Pat. No. 7,676,077, issued on Mar. 9, 2010, both of which are incorporated by reference in the entirety. In addition, the design data may be standard cell library data, integrated layout data, design data for one or more layers, derivatives of the design data, and full or partial chip design data.

It is further noted herein that simulated or acquired images from a wafer or reticle may be used as a proxy for the design. Image analysis may also be used as a proxy for design analysis. For example, shapes or polygons in the design may be extracted from an image of a design printed on a wafer and/or reticle, assuming that the image of the wafer and/or reticle is acquired with sufficient resolution to adequately image the polygons of the design.

Figure 1:
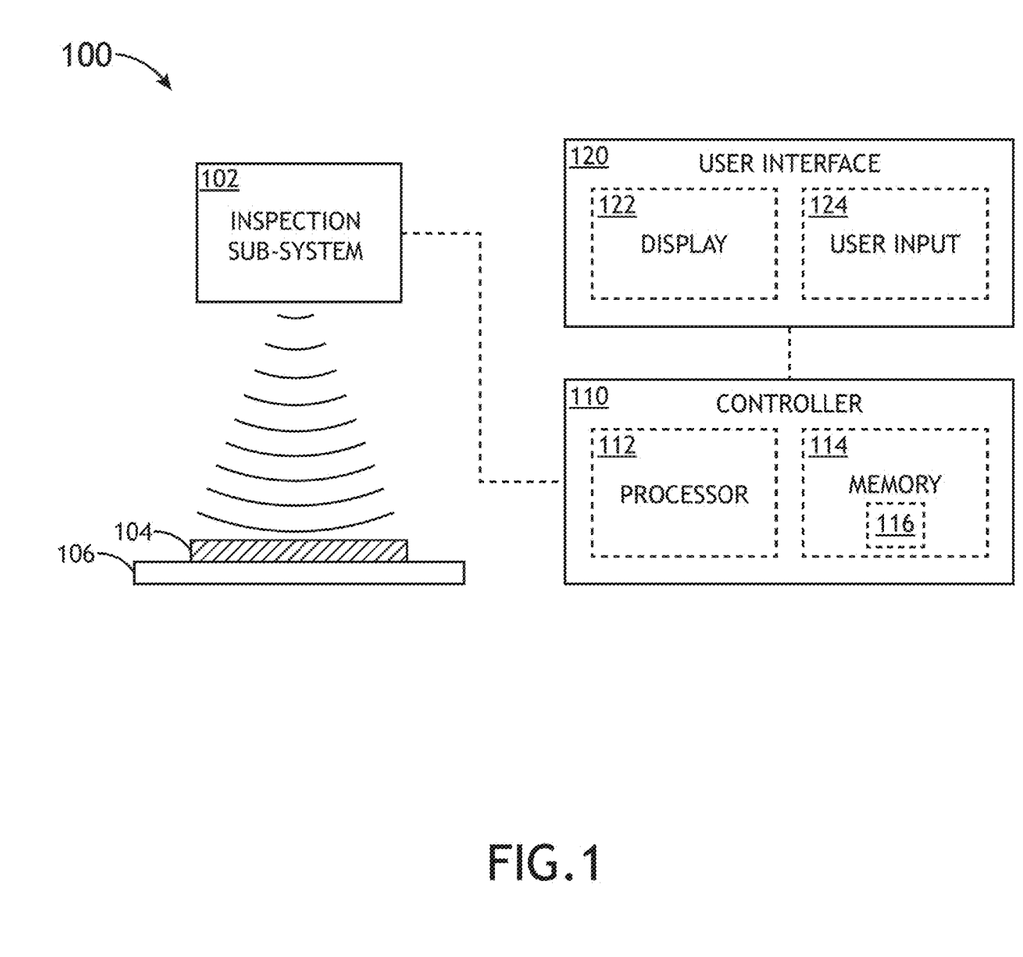
FIG. 1 illustrates a block diagram of a system for wafer inspection, in accordance with one or more embodiments of the present disclosure.

FIG. 1 illustrates a system 100 for sample inspection, in accordance with one or more embodiments of the present disclosure. In one embodiment, the system 100 includes an inspection sub-system 102. In another embodiment, the system 100 includes a sample stage 106 for securing a sample 104. In another embodiment, the system 100 includes a controller 110. In another embodiment, the system 100 includes a user interface 120.

In another embodiment, the inspection sub-system 102 is configured to detect one or more defects on the sample 104. For example, the inspection sub-system 102 may include any appropriate characterization tool known in the art such as, but not limited to, an inspection sub-system or review tool. For example, the inspection sub-system 102 may include, but is not limited to, an electron beam inspection or review tool (e.g., a Scanning Electron Microscope (SEM) system). By way of another example, the inspection sub-system 102 may include, but is not limited to, an optical inspection sub-system. For instance, the optical inspection sub-system may include an optical inspection sub-system capable of generating one or more high-resolution images representing the electrical intent of the wafer 104. Additionally, the optical inspection sub-system may include a broadband inspection sub-system including, but not limited to, a laser sustained plasma (LSP) based inspection sub-system. Further, the optical inspection sub-system may include a narrowband inspection sub-system, such as, but not limited to, a laser scanning inspection sub-system. Further, the optical inspection sub-system may include, but is not limited to, a brightfield imaging tool, or a darkfield imaging tool. It is noted herein that the inspection sub-system 102 may include any optical system configured to collect and analyze illumination reflected, scattered, diffracted, and/or radiated from a surface of a sample 104. Examples of inspection sub-systems are described in U.S. Pat. No. 7,092,082, issued on Aug. 15, 2006; U.S. Pat. No. 6,621,570 issued on Sep. 16, 2003; and U.S. Pat. No. 5,805,278 issued on Sep. 9, 1998, which are each herein incorporated by reference in the entirety. Example of inspection sub-systems are also described in U.S. Pat. No. 8,664,594, issued on Mar. 4, 2014; U.S. Pat. No. 8,692,204, issued on Apr. 8, 2014; U.S. Pat. No. 8,698,093, issued on Apr. 15, 2014; U.S. Pat. No. 8,716,662, issued on May 6, 2014; U.S. Pat. No. 9,638,904, issued on May 2, 2017; U.S. Pat. No. 9,941,655, issued on Apr. 10, 2018; and U.S. Pat. No. 9,558,858, issued on Jan. 31, 2017, which are each herein incorporated by reference in the entirety.

For purposes of the present disclosure, a defect may be classified as a void, short, particle, residue, scum, or any other defect known in the art.

In another embodiment, although not shown, the inspection sub-system 102 may include an illumination source, a detector and various optical components for performing inspection (e.g., lenses, beam splitters, and the like). For example, the illumination source of the inspection sub-system 102 may include any illumination source known in the art. For instance, the illumination source may include, but is not limited to, a broadband light source or a narrowband light source. In addition, the illumination source may be configured to direct light to the surface of the sample 104 (via various optical components) disposed on the sample stage 106. Further, the various optical components of the inspection sub-system 102 may be configured to direct light reflected and/or scattered from the surface of the sample 104 to the detector of the inspection sub-system 102. By way of another example, the detector of the inspection sub-system 102 may include any appropriate detector known in the art. For instance, the detector may include, but is not limited to, photo-multiplier tubes (PMTs), charge coupled devices (CCDs), a time delay integration (TDI) camera, and the like. In addition, the output of the detector may be communicatively coupled to a controller 110, described in detail further herein.

In one embodiment, the sample 104 includes a wafer. For example, the sample 104 may include, but is not limited to, a semiconductor wafer. As used through the present disclosure, the term "wafer" refers to a substrate formed of a semiconductor and/or non-semiconductor material. For instance, a semiconductor or non-semiconductor material may include, but is not limited to, monocrystalline silicon, gallium arsenide, and indium phosphide.

In another embodiment, the sample 104 is manufactured using one or more sets of wafer design data. In another embodiment, the sets of wafer design data include one or more sets of layers. For example, such layers may include, but are not limited to, a resist, a dielectric material, a conductive material, and a semi-conductive material. Many different types of such layers are known in the art, and the term wafer as used herein is intended to encompass a wafer on which all types of such layers may be formed. By way of another example, the layers formed on the wafer may be repeated one or more times within the wafer. Formation and processing of such layers of material may ultimately result in completed devices. Many different types of devices may be formed on a wafer, and the term wafer as used herein is intended to encompass a wafer on which any type of device known in the art is being fabricated.

In another embodiment, the sets of layers include one or more sets of shapes. For example, the sets of shapes may be repeated one or more times within the sets of layers. By way of another example, the sets of shapes may be regularly or irregularly-shaped. In another embodiment, the one or more shapes are one or more polygons. In another embodiment, the shapes/polygons are constructed of one or more primitives, discussed in detail further herein. The implementation of polygons when inspecting the design data of a device is described in U.S. Pat. No. 8,923,600, issued on Dec. 30, 2014; and U.S. Pat. No. 10,223,492, issued on Mar. 5, 2019, which are each herein incorporated by reference in the entirety.

In another embodiment, the sets of layers include one or more sets of cells. For example, the sets of cells may be repeated one or more times within the sets of layers. By way of another example, the sets of cells may be regularly or irregularly-shaped. It is noted herein a particular cell may be repeated between multiple layers of the sets of wafer design data.

In another embodiment, the sets of wafer design data include one or more designs of interest. For example, the designs of interest may be repeated one or more times within the sets of wafer design data. In another embodiment, a particular design of interest may be associated with a particular cell located within the sets of wafer design data.

It is noted herein a particular design of interest may correspond to a particular electrical intent of the sets of wafer design data. As used throughout the present disclosure, electrical intent of the one or more sets of design data includes, but is not limited to, a power line, a ground line, a timing line, a word line, a bit line, a data line, a logic line, and the like.

In another embodiment, the sample stage 106 may include any appropriate mechanical and/or robotic assembly known in the art. For example, the sample stage 106 may be configured to actuate the sample 104 to a selected position or orientation. For instance, the sample stage 106 may include or may be mechanically coupled to one or more actuators, such as a motor or servo, configured to translate or rotate the sample 104 for positioning, focusing, and/or scanning in accordance with a selected inspection or metrology algorithm, several of which are known to the art.

In one embodiment, the controller 110 includes one or more processors 112 and a memory medium 114. In another embodiment, one or more sets of program instructions 116 are stored in memory medium 114. In another embodiment, the one or more processors 112 are configured to execute the sets of program instructions 116 to carry out one or more of the various steps described throughout the present disclosure.

In another embodiment, the user interface 120 is communicatively coupled to the one or more processors 112 of controller 110. In another embodiment, the user interface 120 includes a display device 122. In another embodiment, the user interface 120 includes a user input device 124.

In another embodiment, the controller 110 is configured to receive and/or acquire data or information from other systems or sub-systems (e.g., one or more sets of information from the inspection sub-system 102 or from any of the components of the inspection sub-system 102, or one or more user inputs received via the user interface 120) by a transmission medium that may include wireline and/or wireless portions. In another embodiment, the controller 110 of the system 100 is configured to transmit data or information (e.g., the output of one or more processes disclosed herein) to one or more systems or sub-systems (e.g., one or more commands to the inspection sub-system 102 or to any of the components of the inspection sub-system 102, or one or more outputs displayed on the user interface 120) by a transmission medium that may include wireline and/or wireless portions. In this regard, the transmission medium may serve as a data link between the controller 110 and other sub-systems of the system 100. In another embodiment, the controller 110 is configured to send data to external systems via a transmission medium (e.g., network connection).

In one example, a detector of the inspection sub-system 102 may be coupled to the controller 110 in any suitable manner (e.g., by one or more transmission media indicated by the dotted line shown in FIG. 1) such that the controller 110 may receive the output generated by the detector. By way of another example, if the inspection sub-system 102 includes more than one detector, the controller 110 may be coupled to the multiple detectors as described above. It is noted herein the controller 110 may be configured to detect one or more sites with defects of the sample 104 using detection data collected and transmitted by the inspection sub-system 102, utilizing any method and/or algorithm known in the art to detect sites with defects on the wafer 104. For example, the inspection sub-system 102 may be configured to accept instructions from another sub-system of the system 100 including, but not limited to, controller 110. Upon receiving the instructions from the controller 110, the inspection sub-system 102 may perform an inspection process at the locations of the sample 104 identified in the provided instructions (i.e., the inspection recipe), transmitting the results of the inspection process to the controller 110.

In one embodiment, the set of program instructions 116 are programmed to cause the one or more processors 112 to generate one or more wafer inspection recipes for inspection of the sample 104. For example, the set of program instructions 116 may be programmed to cause the one or more processors 112 to receive one or more sets of wafer data. For instance, the one or more sets of wafer data may include one or more layers. Additionally, the one or more layers may include one or more shapes. Further, the one or more shapes may include one or more primitives. By way of another example, the set of program instructions 116 may be programmed to cause the one or more processors 112 to identify one or more primitives from the one or more shapes. By way of another example, the set of program instructions 116 may be programmed to cause the one or more processors 112 to classify each of the one or more primitives as a particular primitive type. By way of another example, the set of program instructions 116 may be programmed to cause the one or more processors 112 to identify one or primitive characteristics for each of the one or more primitives. By way of another example, the set of program instructions 116 may be programmed to cause the one or more processors 112 to generate a primitive database of the one or more primitives. For instance, the primitive database may include the particular primitive type classification and the one or more identified primitive characteristics for the one or more primitives. By way of another example, the set of program instructions 116 may be programmed to cause the one or more processors 112 to generate one or more rules based on the primitive database. By way of another example, the set of program instructions 116 may be programmed to cause the one or more processors 112 to receive one or more sets of design data. By way of another example, the set of program instructions 116 may be programmed to cause the one or more processors 112 to apply the one or more rules to the one or more sets of design data to identify one or more critical areas. By way of another example, the set of program instructions 116 may be programmed to cause the one or more processors 112 to generate one or more wafer inspection recipes, wherein the recipes include the one or more critical areas for the inspection sub-system.

In another embodiment, the set of program instructions 116 are programmed to cause the one or more processors 112 to generate one or more wafer inspection recipes for inspection of the sample 104. For example, the set of program instructions 116 may be programmed to cause the one or more processors 112 to receive one or more sets of wafer data. For instance, the one or more sets of wafer data may include one or more layers. Additionally, the one or more layers may include one or more shapes. Further, the one or more shapes may include one or more primitives. By way of another example, the set of program instructions 116 may be programmed to cause the one or more processors 112 to identify one or more primitives from the one or more shapes. By way of another example, the set of program instructions 116 may be programmed to cause the one or more processors 112 to identify a combined classification for each of the one or more primitives. By way of another example, the set of program instructions 116 may be programmed to cause the one or more processors 112 to generate a primitive database of the one or more primitives. For instance, the primitive database may include the combined classification for each of the one or more primitives. By way of another example, the set of program instructions 116 may be programmed to cause the one or more processors 112 to generate one or more rules based on the primitive database. By way of another example, the set of program instructions 116 may be programmed to cause the one or more processors 112 to receive one or more sets of design data. By way of another example, the set of program instructions 116 may be programmed to cause the one or more processors 112 to apply the one or more rules to the one or more sets of design data to identify one or more critical areas. By way of another example, the set of program instructions 116 may be programmed to cause the one or more processors 112 to generate one or more wafer inspection recipes, wherein the recipes include the one or more critical areas for the inspection sub-system.

In one embodiment, the one or more processors 112 of controller 110 include any one or more processing elements known in the art. In this sense, the one or more processors 112 may include any microprocessor device configured to execute algorithms and/or instructions. For example, the one or more processors 112 may consist of a desktop computer, mainframe computer system, workstation, image computer, parallel processor, vehicle on-board computer, handheld computer (e.g., tablet, smartphone, or phablet), or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute the program instructions 116 from a non-transitory memory medium (e.g., memory 114). Moreover, different subsystems of the system 100 (e.g., inspection sub-system 102 or user interface 120) may include processor or logic elements suitable for carrying out at least a portion of the steps described throughout the present disclosure. Therefore, the above description should not be interpreted as a limitation on the present invention but merely as an illustration.

In one embodiment, the memory medium 114 of controller 110 includes any storage medium known in the art suitable for storing the program instructions 116 executable by the associated one or more processors 112. For example, the memory medium 114 may include a non-transitory memory medium. For instance, the memory medium 114 may include, but is not limited to, a read-only memory, a random access memory, a magnetic or optical memory device (e.g., disk), a magnetic tape, a solid state drive, and the like. In another embodiment, it is noted herein that the memory 114 is configured to provide display information to a display device 122 and/or the output of the various steps described herein. It is further noted that memory 114 may be housed in a common controller housing with the one or more processors 112. In an alternative embodiment, the memory 114 may be located remotely with respect to the physical location of the processors 112 and controller 110. For instance, the one or more processors 112 of controller 110 may access a remote memory (e.g., server), accessible through a network (e.g., internet, intranet and the like). In another embodiment, the memory medium 114 stores the program instructions 116 for causing the one or more processors 112 to carry out the various steps described through the present disclosure.

In one embodiment, the display device 122 includes any display device known in the art. For example, the display device may include, but is not limited to, a liquid crystal display (LCD). By way of another example, the display device may include, but is not limited to, an organic light-emitting diode (OLED) based display. By way of another example, the display device may include, but is not limited to, a CRT display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with the user input device (e.g., touchscreen, bezel mounted interface, keyboard, mouse, trackpad, and the like) is suitable for implementation in the present invention.

In one embodiment, the user input device 124 includes any user input device known in the art. For example, user input device 124 may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device, or the like. In the case of a touchscreen interface, those skilled in the art should recognize that a large number of touchscreen interfaces may be suitable for implementation in the present invention. For instance, the display device 122 may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user input device 124 may include, but is not limited to, a bezel mounted interface.

The embodiments of the system 100 illustrated in FIG. 1 may be further configured as described herein. In addition, the system 100 may be configured to perform any other steps(s) of any of the system and method embodiment(s) described herein.

Figure 2:
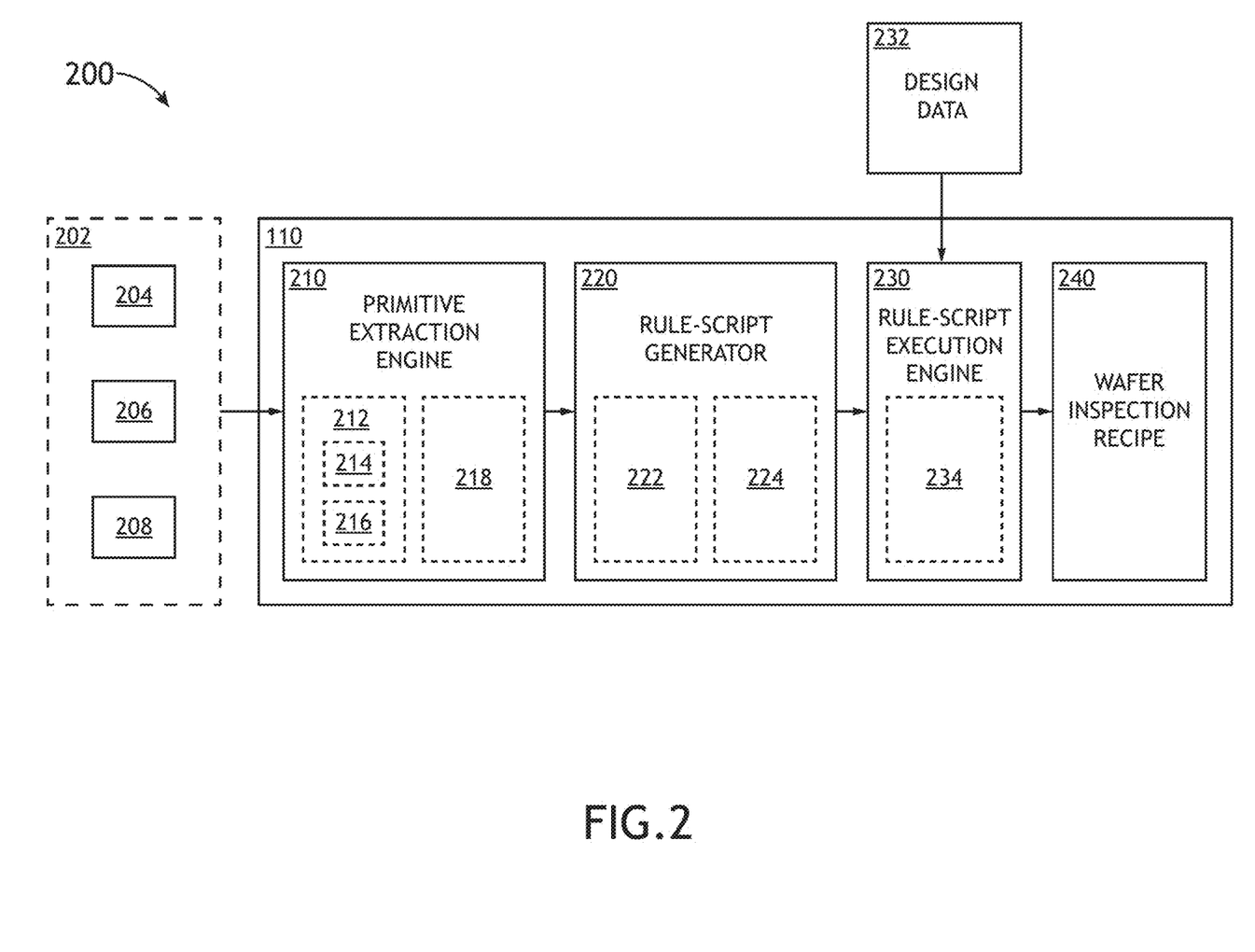
FIG. 2 illustrates a block diagram for generating one or more critical areas for use in one or more wafer inspection recipes, in accordance with one or more embodiments of the present disclosure.

FIG. 2 illustrates a system 200 for generating one or more critical areas for use in wafer inspection, in accordance with one or more embodiments of the present disclosure. It is noted herein that the various system and method embodiments, components and architecture described previously herein should be interpreted to extend to the system 200 of FIG. 2.

In one embodiment, the system 200 includes one or more sets of wafer data 202 received by the controller 110. In another embodiment, the sets of wafer data 202 include one or more layers. In another embodiment, the sets of layers include one or more sets of shapes. In another embodiment, the sets of shapes include one or more primitives 212. It is noted herein the shape may be a polygon.

It is noted herein the wafer data 202 may include one or more defect sites. For example, the one or more defect sites may represent locations on the wafer 104 where pattern failures have been observed. By way of another example, the one or more defect sites may represent locations deemed to be "weak" or "potential failure sites" (e.g., locations and/or pattern arrangements on the wafer that are likely to fail).

In another embodiment, the sets of wafer data 202 include one or more sets of design clips 204. For example, the sets of design clips 204 may be in a binary image format. For instance, the sets of design clips 204 may be converted into a value 1 for the pattern and a value 0 for the background, from which one or more binary design image clips 204 are formed. By way of another example, the design clips 204 may be described in one or more textual descriptions, where the textual descriptions describe the design clips 204 as polygons. In this example, the textual description may be received by the controller 110.

In another embodiment, the one or more defect sites in the sets of wafer data 202 may be located via an inspection sub-system or from a library of information acquired from an inspection sub-system. In another embodiment, the sets of wafer data 202 include one or more inspection images 206 of a selected region of a sample 104. In another embodiment, the inspection images 206 may be collected by the inspection sub-system 102. For example, the inspection sub-system 102 may include, but is not limited to, an electron beam inspection or review tool (e.g., SEM system) or an optical inspection sub-system capable of generating one or more high-resolution images representing the electrical intent of the wafer 104. By way of another example, the selected region of the sample 104 may be the entire sample 104. By way of another example, the selected region of the sample 104 may be a portion of the sample 104. In another embodiment, the one or more high-resolution images representing the electrical intent of the wafer 104 generated by the optical inspection system are converted to wafer data 202.

In another embodiment, the sets of wafer data 202 include one or more sets of simulation data 208 received from a simulation sub-system including, but not limited to, PROLITH™ of KLA-Tencor, Milpitas, Calif. ("KT"). In another embodiment, the sets of simulation data 208 are based on design data. In another embodiment, the sets of simulation data 208 predict the sets of wafer data 202.

It is noted herein the wafer data 202 may include only a portion of the data for a particular wafer 104. For example, the portion of the data may include one or more potential failure sites on the wafer 104, that portion contained in any of a design clip 204, a high-resolution inspection image 206, or the sets of simulation data 208 for the wafer 104.

In another embodiment, the system 200 includes a primitive extraction engine 210 in the controller 110. In another embodiment, the primitive extraction engine 210 receives the sets of wafer data 202. In another embodiment, the primitive extraction engine 210 extracts the primitives 212 from the sets of wafer data 202. In another embodiment, the primitive extraction engine 210 classifies each of the primitives 212 as a primitive type 214. For instance, a primitive type 214 may include, but is not limited to, a line or a corner. In another embodiment, the primitive extraction engine 210 identifies one or more characteristics 216 for each of the primitives 212. For instance, the one or more characteristics 216 may include, but are not limited to, width of a line (e.g., thick, medium, or thin), length of a line, portion of a line, (e.g., long edge is a line "side", short edge is a line "end"), corner direction (e.g., convex or concave), or one or more spatial locations of the primitive 212 relative to the wafer 104, spatial orientation (e.g., horizontal or vertical layout on a 2D image) of the primitive 212 relative to the wafer 104, or spacing between two or more primitives 212 on the wafer 104. It is noted herein that the application of primitive types 214 and primitive characteristics 216 for wafer inspection and review is further described in U.S. Pat. No. 9,965,848, issued on May 8, 2018, which is incorporated by reference in its entirety.

Although embodiments of the present disclosure are directed to the primitive types 214 and primitives characteristics 216 being separate sets of information for the primitives 212, it is noted herein a combined classification may be identified for each of the primitives 212. For example, the combined classification may include, but is not limited to, a "thick line", a "medium line", a "thin line", a "convex corner", or a "concave corner". By way of another example, the combined classification may include, but is not limited to, one or more shape interactions including, but not limited to, spatial location of the primitive 212 relative to the wafer 104, spatial orientation (e.g., horizontal or vertical layout on a 2D image) of the primitive 212 relative to the wafer 104, or spacing between two or more primitives 212 on the wafer 104.

Figure 3A:
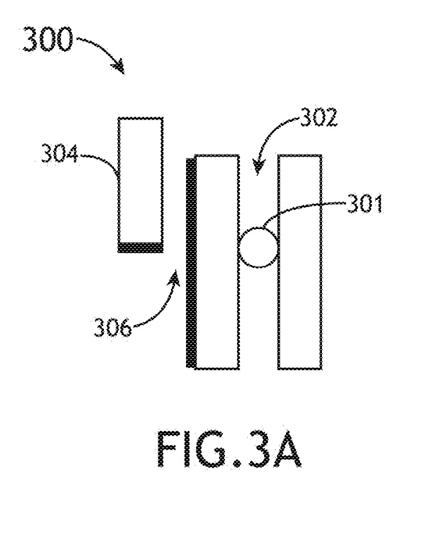
FIG. 3A illustrates a shape interaction in a wafer pattern, in accordance with one or more embodiments of the present disclosure.
Figure 3B:
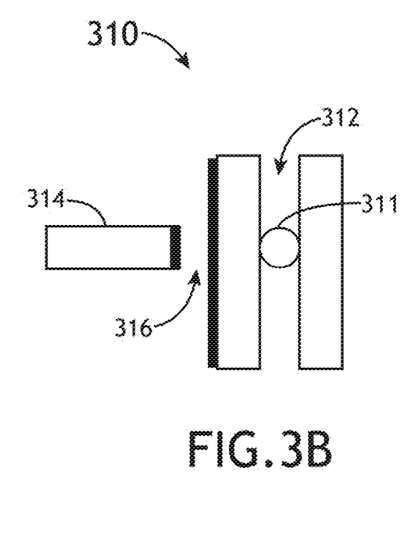
FIG. 3B illustrates a shape interaction in a wafer pattern, in accordance with one or more embodiments of the present disclosure.
Figure 3C:
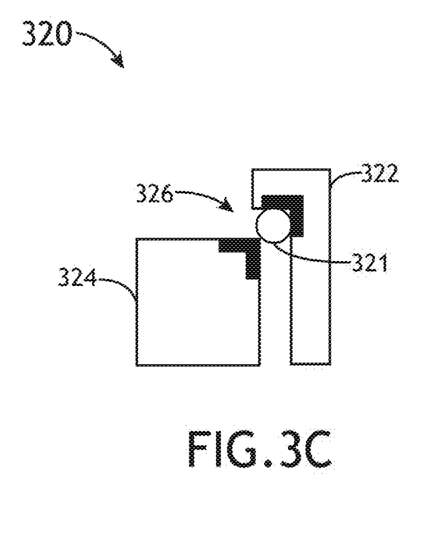
FIG. 3C illustrates a shape interaction in a wafer pattern, in accordance with one or more embodiments of the present disclosure.

FIGS. 3A-3C illustrates specific shape interactions on a wafer, in accordance with one or more embodiments of the present disclosure.

In one embodiment, FIG. 3A illustrates a possible pattern 300 on the wafer 104. In another embodiment, the pattern 300 includes a set 302 of one or more dense thin lines separated by a spacing 301. In another embodiment, the pattern 300 includes a separate structure 304. In another embodiment, the pattern 300 includes a shape interaction 306. For example, the shape interaction 306 may be defined as the interaction between a line end of the separate structure 304 perpendicular to the side of the set 302 of dense thin lines.

In one embodiment, FIG. 3B illustrates a possible pattern 310 on the wafer 104. In another embodiment, the pattern 310 includes a set 312 of one or more dense thin lines separated by a spacing 311. In another embodiment, the pattern 310 includes a separate structure 314. In another embodiment, the pattern 310 includes a shape interaction 316. For example, the shape interaction 316 may be defined as the interaction between a line end of the separate structure 314 parallel to the side of the set 312 of dense thin lines.

In one embodiment, FIG. 3C illustrates a possible pattern 320 on the wafer 104. In another embodiment, the pattern 320 includes a first structure 322. In another embodiment, the pattern 300 includes a second structure 324. In another embodiment, a convex corner of the second structure 324 is surrounded by a concave corner of the first structure 322, such that the first structure 322 and second structure 324 are separated by a spacing 321. In another embodiment, the pattern 300 includes a shape interaction 326. For example, the shape interaction 326 may be defined as the interaction between the convex corner of structure 324 and the concave corner of structure 322.

It is noted herein the shape interactions are not limited to the interactions 306, 316, 326 as embodied, and may include any number of additional shape interactions.

In another embodiment, the primitive extraction engine 210 records information about the primitives 212 into a primitive database 218. For example, the primitive database 218 may include the primitive type 214 and the characteristics 216 for each primitive 212. By way of another example, the primitive database 218 may include the combined classification for each primitive 212. By way of another example, the primitive database 218 may include, but is not limited to, a list, table, or formatted text data file.

In another embodiment, the system 200 includes a rule script generator 220. In another embodiment, the rule script generator 220 receives the primitive database 218 of the primitives 212. In another embodiment, the rule script generator 220 analyzes the primitive database 218 of the primitives 212 to generate one or more rules 222. In another embodiment, the one or more rules 222 associate one or more of the primitives 212 in one or more patterned arrangements to one or more potential failure sites. For example, the one or more potential failure sites may include electrical intent of the wafer 104 that may fail.

In another embodiment, the rule script generator 220 generates one or more executable scripts 224 from the one or more rules 222. In another embodiment, the syntax of the executable scripts 224 is dependent on the type of a rule-script execution engine 230 executing the executable scripts 224. For example, the executable scripts 224 may be in SVRF® format where the rule-script execution engine 230 is a DRC engine proprietary to Mentor Graphics, Wilsonville, Oreg. It is noted herein, however, that any other rule engine could also be employed as the rule-script execution engine 230 by modifying the format of the executable scripts 224 generated by executing the rule script generator 220.

In another embodiment, the system 200 includes the rule-script execution engine 230. In another embodiment, the rule-script execution engine 230 receives the executable scripts 224. In another embodiment, the rule-script execution engine 230 receives one or more sets of design data 232 received into the controller 110. In another embodiment, the rule-script execution engine 230 applies the one or more executable scripts 224 to the one or more sets of design data 232 to identify one or more critical areas 234. In another embodiment, the critical areas 234 are identified as locations in the sets of design data 232 that satisfy one or more constraints in the executable scripts 224. For example, the one or more constraints may be related to one or more potential failure sites. In this regard, the critical areas 234 are a subset of the design data 232.

It is further noted herein the design data 232 may include the entire design data for a particular wafer 104. For example, the design data 232 may be an ideal representation of the wafer 104 to be printed.

In another embodiment, one or more wafer inspection recipes 240 are generated. In another embodiment, the generated wafer inspection recipes 240 include the critical areas 234 output from the rule-script execution engine 230. In another embodiment, the controller 110 implements the wafer inspection recipes 240 to locate one or more defects in one or more images of an inspected wafer received from the inspection sub-system 102. In another embodiment, the one or more wafer inspection recipes 240 are transmitted to the inspection sub-system 102 by the controller 110.

Advantages of the present disclosure include analyzing the sets of wafer data 202 to determine particular geometric shapes or shape interactions that are of interest based on possibility of failure. Advantages of the present disclosure also include generating one or more rules 222 that includes a generalized description of potential failure patterns in the one or more sets of wafer data, instead of a set or list of the specific components of potential failure patterns. The generalized description includes a set of "fuzzy" rules that are more likely to flag a larger set of design patterns that are less likely to fail than previous methods.

It is noted herein that execution of one or more of the primitive extraction engine 210, the rule-script generator 220, or the rule-script execution engine 230 may be performed automatically by the controller 110. As such, advantages of the present disclosure also include automatically generating the one or more of the primitive database 218, the rules 222, the executable scripts 224, or the critical areas 234 utilized to flag the regions of interest of a wafer. In this regard, no manual development of the one or more rules may be required, thus removing a potential source of error and the requirement of expertise necessary to understand the critical shape interactions to develop the rules.

It is further noted herein, however, that implementation of one or more of the primitive extraction engine 210, the rule-script generator 220, or the rule-script execution engine 230 may be performed by the controller 110 following a prompt or command by a user.

Figure 4:
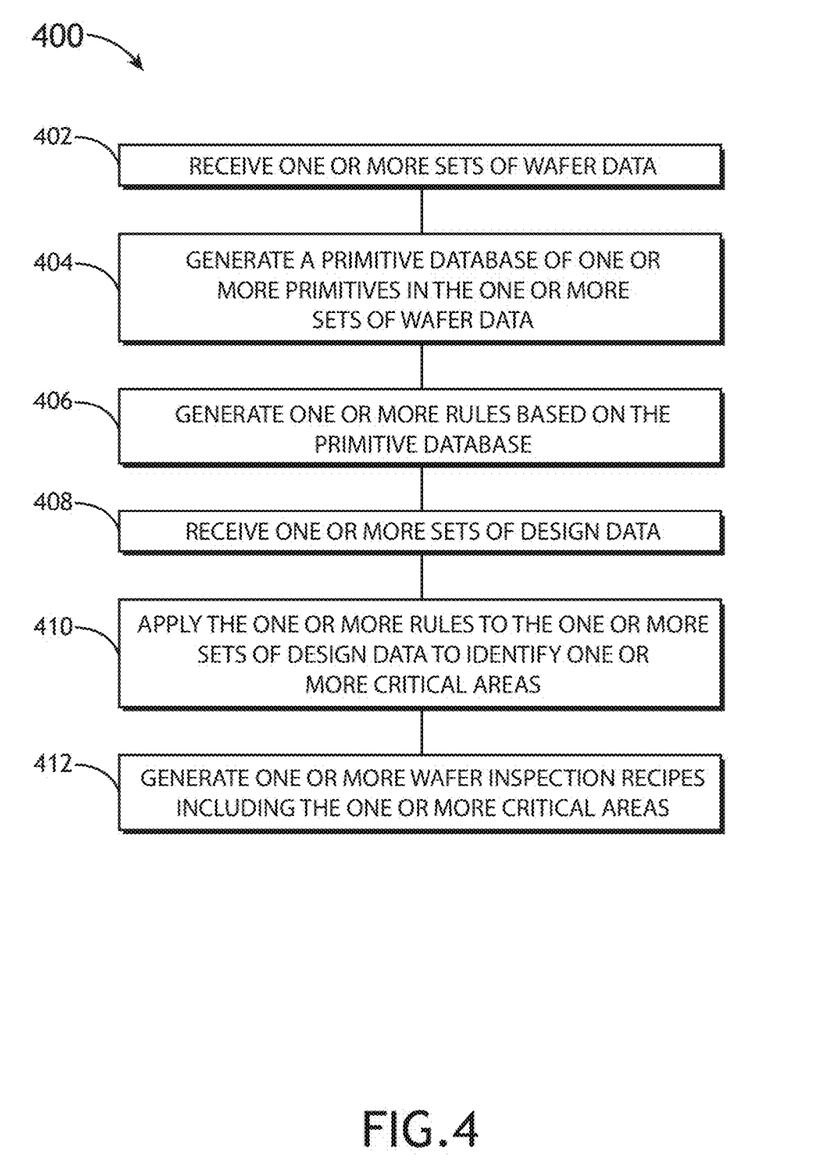
FIG. 4 illustrates a process flow diagram for automatically generating one or more critical areas for use in one or more wafer inspection recipes, in accordance with one or more embodiments of the present disclosure.

FIG. 4 illustrates a method 400 for generating one or more wafer inspection recipes based on one or more critical areas. The method 400 may also include any other step(s) that can be performed by the output acquisition subsystem and/or computer sub-system(s) or system(s) described herein. The steps may be performed by one or more computer systems, which may be configured according to any of the embodiments described herein. It is noted herein that the steps of method 400 may be implemented all or in part by the system 100. It is recognized, however, that the method 400 is not limited to the system 100 in that additional or alternative system-level embodiments may carry out all or part of the steps of method 400.

In step 402, one or more sets of wafer data 202 are received. For example, the sets of wafer data 202 may be received by the controller 110. In one embodiment, the one or more images include one or more layers. In another embodiment, the one or more layers include one or more shapes. In another embodiment, the one or more shapes include one or more primitives 212. It is noted herein the sets of wafer data 202 may include one or more sites with defects of the wafer 104.

In another embodiment, the sets of wafer data 202 include one or more sets of design clips 204. For example, the design clips 204 may be in a binary image format. In another embodiment, the design clips 204 are described in one or more textual descriptions, the textual descriptions received by the controller 110. In another embodiment, the sets of wafer data 202 include one or more inspection images 206 of the selected region of the sample 104. For example, the inspection images 206 may be collected by the inspection sub-system 102. For instance, the inspection sub-system 102 may include, but is not limited to, an electron beam inspection or review tool (e.g., SEM system), or an optical inspection sub-system capable of producing one or more high-resolution images representing the electrical intent of the wafer 104. In another embodiment, the sets of wafer data 202 include one or more sets of simulated data 208 received from a simulation sub-system. In another embodiment, the sets of simulation data 208 are based on design data. In another embodiment, the sets of simulation data 208 predict the sets of wafer data 202.

In step 404, a primitive database 218 of the primitives 212 in the sets of wafer data 202 is generated. In one embodiment, a primitive extraction engine 210 identifies the primitives 212. In another embodiment, the primitive extraction engine 210 classifies each primitive 212 as a particular primitive type 214 (e.g. line, corner, and the like). In another embodiment, the primitive extraction engine 210 identifies one or more primitive characteristics 216 for each of the primitives 212. For instance, the one or more characteristics 216 may include, but are not limited to, width of a line (e.g., thick, medium, or thin), length of a line, portion of a line, (e.g., long edge is a line "side", short edge is a line "end"), corner direction (e.g., convex or concave), or one or more spatial locations of the primitive 212 relative to the wafer 104, spatial orientation (e.g., horizontal or vertical layout on a 2D image) of the primitive 212 relative to the wafer 104, or spacing between two or more primitives 212 on the wafer 104.

Alternatively, the primitive extraction engine 210 may identify a combined classification for each of the primitives 212. For instance, the sets of information extracted for a particular primitive 212 may include a combined classification such as, but is not limited to, "thick line", "medium line", "thin line", "convex corner", or "concave corner". Additionally, the combined classification may include, but is not limited to, one or more shape interactions including, but not limited to, spatial location of the primitive 212 relative to the wafer 104, spatial orientation (e.g., horizontal or vertical layout on a 2D image) of the primitive 212 relative to the wafer 104, or spacing between two or more primitives 212 on the wafer 104.

In another embodiment, the primitive database 218 of the primitives 212 is generated by executing the primitive extraction engine 210. For example, the primitive database 218 of the primitives 212 may include the separate sets of information of the primitive type 214 and the primitive characteristics 216 for each of the primitives 212. By way of another example, the primitive database 218 may include the combined classification for each of the primitives 212.

In a step 406, one or more rules 222 based on the primitive database 218 are generated. In one embodiment, the rules 222 are generated by executing the rule-script generator 220. In another embodiment, the rules 222 are based on the primitive database 218 of the primitives 212. In another embodiment, the one or more rules 222 associate one or more of the primitives 212 in one or more patterned arrangements to one or more potential failure sites. For example, the one or more potential failure sites may include one or more electrical intents of the wafer 104 that may fail.

In a step 408, one or more sets of design data 232 are received. In another embodiment, the one or more sets of design data 232 are received by the controller 110. In another embodiment, the one or more sets of design data 232 are received by the rule-script execution engine 230 via the controller 110.

In a step 410, the one or more rules 222 are applied to the one or more sets of design data 232 to identify the one or more critical areas 234. In one embodiment, one or more executable scripts 224 are generated from the rules 222 by executing the rule-script generator 220. In another embodiment, the executable scripts 224 are received by the rule-script execution engine 230. In another embodiment, the critical areas 234 are identified as locations in the received sets of design data 232 that satisfy one or more constraints in the executable scripts 224. For example, the one or more constraints may be related to one or more potential failure sites. In this regard, the critical areas 234 are a subset of the design data 232.

In a step 412, one or more wafer inspection recipes 240 are generated. In one embodiment, the wafer inspection recipes 240 include the critical areas 234 output from the rule-script execution engine 230. In another embodiment, the wafer inspection recipes 240 are transmitted to the inspection sub-system 102 by the controller 110. In another embodiment, the wafer inspection recipes 240 are implemented by the controller 110 to locate one or more defects in one or more images of an inspection wafer received from the inspection sub-system 102.

It is noted herein the results of present disclosure (e.g., the wafer inspection recipes 240 including the critical areas 234) may be used by the controller 110 (or another controller, a user, or a remote server) to provide feedback or feedforward information to one or more processing tools of a semiconductor device fabrication line. In this regard, one or more results observed or measured by the system 100 may be used to adjust process conditions at previous stages (feedback) or subsequent stages (feedforward) of the semiconductor device fabrication line.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed:

1. A system for generating one or more wafer inspection recipes for wafer inspection comprising:
    an inspection sub-system; and
    a controller communicatively coupled to the inspection sub-system, wherein the controller includes one or more processors configured to execute a set of program instructions stored in memory, wherein the program instructions are configured to cause the one or more processors to:
    receive one or more sets of wafer data, wherein the one or more sets of wafer data include one or more layers, wherein the one or more layers include one or more shapes;
    identify one or more primitives from the one or more shapes;
    classify each of the one or more primitives as a particular primitive type;
    identify one or more primitive characteristics for each of the one or more primitives;
    generate a primitive database of the one or more primitives, wherein the primitive database includes the particular primitive type and the one or more primitive characteristics for each of the one or more primitives;
    generate one or more rules based on the primitive database;
    receive one or more sets of design data;
    apply the one or more rules to the one or more sets of design data to identify one or more critical areas, wherein the one or more rules associate the one or more of primitives in one or more patterned arrangements in the one or more sets of design data to one or more potential failure sites, wherein the one or more potential failure sites include one or more potential sites of electrical intent failure;
    generate one or more wafer inspection recipes for the inspection sub-system, wherein the one or more wafer inspection recipes include the one or more critical areas, wherein a particular critical area includes the one or more potential failure sites; and
    transmit the inspection recipe to the inspection sub-system for inspection of one or more wafers.

2. The system in claim 1, wherein the one or more sets of wafer data comprise one or more design clips.

3. The system in claim 2, wherein the one or more design clips include one or more binary design images.

4. The system in claim 3, wherein the one or more binary design images include a pattern and a background, wherein the pattern has a value 1 and the background has a value 0.

5. The system in claim 2, wherein the one or more design clips are described in one or more textual descriptions.

6. The system in claim 1, wherein the one or more sets of wafer data comprise one or more high-resolution inspection images.

7. The system in claim 1, wherein the one or more sets of wafer data comprise one or more sets of simulation data received from a simulation sub-system.

8. The system in claim 1, wherein the program instructions are configured to cause the one or more processors to:
    classify the one or more primitives as a particular primitive type by executing a primitive extraction engine.

9. The system in claim 1, wherein the program instructions are configured to cause the one or more processors to:
    identify one or more primitive characteristics of the one or more primitives by executing a primitive extraction engine.

10. The system in claim 1, wherein the program instructions are configured to cause the one or more processors to:
    generate the primitive database by executing a primitive extraction engine.

11. The system in claim 1, wherein the program instructions are configured to cause the one or more processors to:
generate the one or more rules based on the primitive database by executing a rule-script generator.

12. The system in claim 1, wherein the one or more critical areas are identified in the one or more sets of design data by executing a rule-script execution engine, wherein the one or more critical areas satisfy one or more constraints in one or more executable scripts, wherein the one or more executable scripts are generated by executing a rule-script generator, wherein the one or more executable scripts include the one or more rules.

13. The system in claim 1, wherein the particular primitive type comprises:
at least one of a line or a corner.

14. The system in claim 1, wherein the one or more primitive characteristics comprise:
at least one of a thick line, a medium line, a thin line, a line end, a line side, a convex corner, a concave corner, or a shape interaction,
wherein the shape interaction includes at least one of a spatial location of the one or more primitives, a spatial orientation of the one or more primitives, or a spacing between two or more primitives.

15. The system in claim 1, wherein the primitive database comprises:
at least one of a list, a table, or a formatted text data file.

16. The system in claim 1, wherein the inspection sub-system comprises:
at least one of an electron-beam inspection sub-system or an optical inspection sub-system capable of generating one or more high-resolution images.

17. A method for generating one or more wafer inspection recipes for wafer inspection comprising:
receiving one or more sets of wafer data, wherein the one or more sets of wafer data include one or more layers, wherein the one or more layers include one or more shapes;
identifying one or more primitives from the one or more shapes;
classifying each of the one or more primitives as a particular primitive type;
identifying one or more primitive characteristics for each of the one or more primitives;
generating a primitive database of the one or more primitives, wherein the primitive database includes the particular primitive type and the one or more primitive characteristics for each of the one or more primitives;
generating one or more rules based on the primitive database;
receiving one or more sets of design data;
applying the one or more rules to the one or more sets of design data to identify one or more critical areas, wherein the one or more rules associate the one or more of primitives in one or more patterned arrangements in the one or more sets of design data to one or more potential failure sites, wherein the one or more potential failure sites include one or more potential sites of electrical intent failure;
generating one or more wafer inspection recipes for an inspection sub-system, wherein the one or more wafer inspection recipes include the one or more critical areas, wherein a particular critical area includes the one or more potential failure sites; and
transmitting the inspection recipe to the inspection sub-system for inspection of one or more wafers.

18. The method in claim 17, wherein the one or more sets of wafer data comprise one or more design clips.

19. The method in claim 18, wherein the one or more design clips include one or more binary design images.

20. The method in claim 19, wherein the one or more binary design images include a pattern and a background, wherein the pattern has a value 1 and the background has a value 0.

21. The method in claim 18, wherein the one or more design clips are described in one or more textual descriptions.

22. The method in claim 17, wherein the one or more sets of wafer data comprise one or more high-resolution inspection images.

23. The method in claim 17, wherein the one or more sets of wafer data comprise one or more sets of simulation data received from a simulation sub-system.

24. The method in claim 17, further comprising:
classifying the one or more primitives as a particular primitive type by executing a primitive extraction engine.

25. The method in claim 17, further comprising:
identifying one or more primitive characteristics of the one or more primitives by executing a primitive extraction engine.

26. The method in claim 17, further comprising:
generating the primitive database by executing a primitive extraction engine.

27. The method in claim 17, further comprising:
generating the one or more rules based on the primitive database by executing a rule-script generator.

28. The method in claim 17, wherein the one or more critical areas are identified in the one or more sets of design data by executing a rule-script execution engine, wherein the one or more critical areas satisfy one or more constraints in one or more executable scripts, wherein the one or more executable scripts are generated by executing a rule-script generator, wherein the one or more executable scripts include the one or more rules.

29. The method in claim 17, wherein the particular primitive type comprises:
at least one of a line or a corner.

30. The method in claim 17, wherein the one or more primitive characteristics comprise:
at least one of a thick line, a medium line, a thin line, a line end, a line side, a convex corner, a concave corner, or a shape interaction,
wherein the shape interaction includes at least one of a spatial location of the one or more primitives, a spatial orientation of the one or more primitives, or a spacing between two or more primitives.

31. The method in claim 17, wherein the primitive database comprises:
at least one of a list, a table, or a formatted text data file.

32. The method in claim 17, wherein the inspection sub-system comprises:
at least one of an electron-beam inspection sub-system or an optical inspection sub-system capable of generating one or more high-resolution images.

* * * * *